United States Patent
Schemenaur et al.

(10) Patent No.: US 6,444,140 B2
(45) Date of Patent: Sep. 3, 2002

(54) MICRO-ETCH SOLUTION FOR PRODUCING METAL SURFACE TOPOGRAPHY

(75) Inventors: John Schemenaur, Scottsdale; Todd Johnson, Tempe; Michael Marsaglia, Phoeniz, all of AZ (US)

(73) Assignee: Morton International Inc., Chicago, IL (US)

( * ) Notice: Subject to any disclaimer, the term of this patent is extended or adjusted under 35 U.S.C. 154(b) by 0 days.

(21) Appl. No.: 09/270,690

(22) Filed: Mar. 17, 1999

(51) Int. Cl.⁷ ................................................. B44C 1/22
(52) U.S. Cl. ........................ 216/100; 216/96; 216/102; 216/103; 216/105; 216/106; 252/79.1; 252/79.2
(58) Field of Search ................................ 216/106, 100, 216/103, 105, 102, 96; 252/79.1, 79.2

(56) References Cited

U.S. PATENT DOCUMENTS

| | | | |
|---|---|---|---|
| 2,746,848 A | 5/1956 | Jones ........................... 41/42 |
| 3,114,657 A | 12/1963 | Stilwell ....................... 134/28 |
| 3,136,670 A | 6/1964 | Rogers et al. ................ 156/13 |
| 3,148,100 A | 9/1964 | Elston et al. ................. 156/14 |
| 3,216,873 A | 11/1965 | Jones ........................... 156/14 |
| 3,293,093 A | 12/1966 | Jones et al. .................. 156/18 |
| 3,312,625 A | 4/1967 | Peterson ..................... 252/149 |
| 3,341,384 A | 9/1967 | Alderuccio et al. ........... 156/18 |
| 3,407,141 A | 10/1968 | Banush et al. .............. 252/79.4 |
| 3,458,371 A | 7/1969 | Borth et al. ................. 156/14 |
| 3,458,372 A | 7/1969 | Borth et al. |
| 3,649,194 A | 3/1972 | Glanville |
| 3,668,131 A | 6/1972 | Banush et al. |
| 3,770,530 A | 11/1973 | Fujimoto |
| 3,948,703 A | 4/1976 | Kushibe |
| 3,954,645 A | 5/1976 | Otrhalek et al. |
| 3,969,260 A | 7/1976 | Clark |
| 3,979,311 A | 9/1976 | Clark |
| 3,992,313 A | 11/1976 | Anderson et al. |
| 4,051,057 A | 9/1977 | Ericson et al. |
| 4,086,128 A | 4/1978 | Sugio et al. |
| 4,140,646 A | 2/1979 | Kent et al. |
| 4,141,850 A | 2/1979 | Readio et al. |
| 4,144,119 A * | 3/1979 | Dutkewych et al. ........ 156/659 |
| 4,180,469 A | 12/1979 | Anderson |
| 4,233,113 A | 11/1980 | Valayil et al. |
| 4,459,216 A | 7/1984 | Nakazato et al. |
| 4,642,161 A | 2/1987 | Akahoshi et al. |
| RE32,555 E | 12/1987 | Czaja ......................... 252/79.3 |
| 4,717,439 A | 1/1988 | Hajdu et al. |
| 4,751,106 A | 6/1988 | Wilkinson et al. |
| 4,784,785 A | 11/1988 | Cordani et al. |
| 4,859,281 A | 8/1989 | Goltz |
| 4,873,136 A | 10/1989 | Foust et al. |
| 4,915,781 A | 4/1990 | Bohnen et al. |
| 5,030,373 A | 7/1991 | Kimura et al. |
| 5,037,482 A | 8/1991 | Kukanskis et al. |
| 5,106,454 A | 4/1992 | Allardyce et al. |
| 5,492,595 A * | 2/1996 | Carano et al. ............... 216/101 |
| 5,532,094 A | 7/1996 | Arimura et al. |
| 5,538,152 A | 7/1996 | Fontana |
| 5,800,859 A | 9/1998 | Price et al. |
| 5,861,076 A * | 1/1999 | Adlam et al. ................ 156/281 |
| 5,869,130 A | 2/1999 | Ferrier |
| 6,117,250 A * | 9/2000 | Schemenaur et al. ........ 148/248 |

* cited by examiner

*Primary Examiner*—Randy Gulakowski
*Assistant Examiner*—M. Kornakov
(74) *Attorney, Agent, or Firm*—John J. Piskorski; S. Matthew Cairns

(57) ABSTRACT

Metal surfaces, particularly copper surfaces, which are oxidatively micro-etched to increase surface area through the use of molybdenum. The micro-etch solutions contain a proton source, e.g., a mineral acid, an oxidizer agent, e.g., hydrogen peroxide, an azole compound, and a molybdenum source.

These micro-etched surfaces can further be rendered acid-resistant by exposure to a thiazole compound and/or a thiocarbamide compound. The thiazole compound and/or thiocarbamide compound may be provided either in the oxidative micro-etching solution or provided in a post-micro-etching solution.

50 Claims, 1 Drawing Sheet

Figure 1. Without Mo
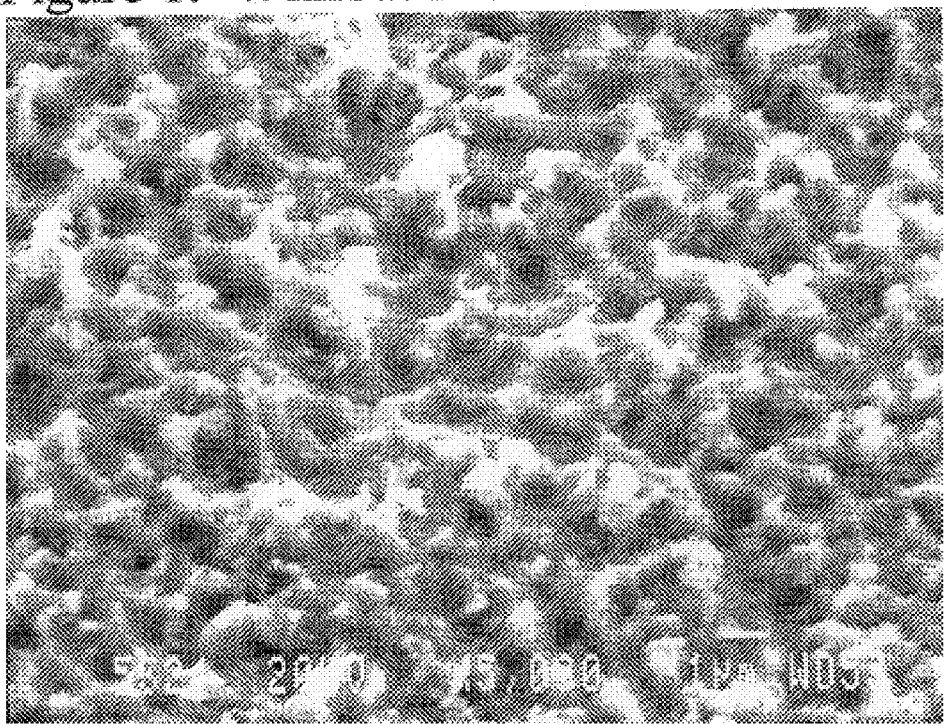
Figure 2. With Mo
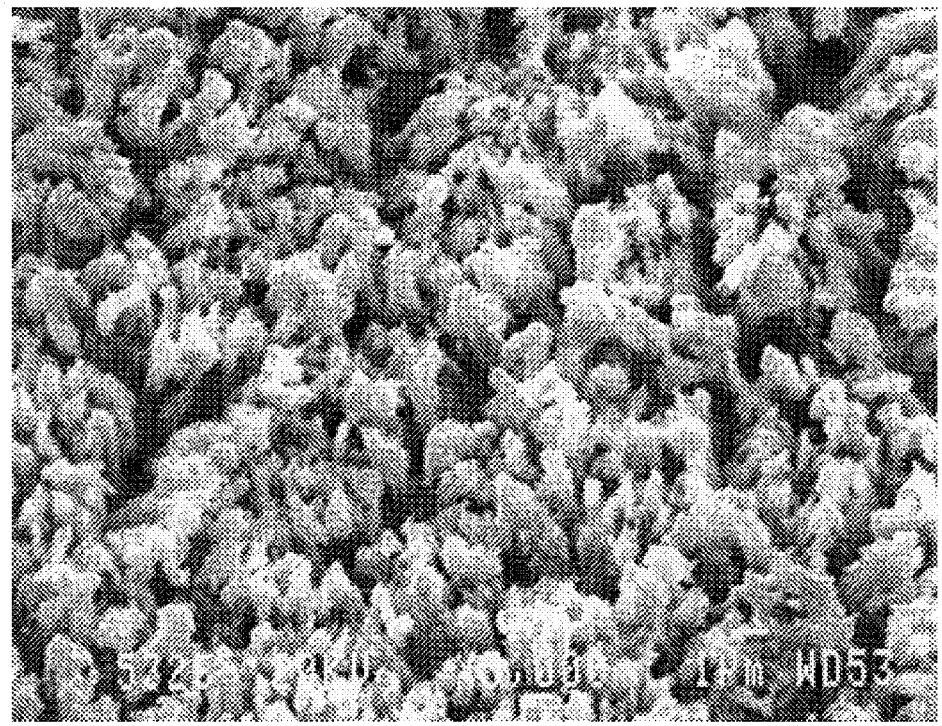

MICRO-ETCH SOLUTION FOR PRODUCING METAL SURFACE TOPOGRAPHY

The present invention is directed to printed circuit boards, particularly multi-layer printed circuit boards. Specifically, the invention is directed to micro-etching of metal, particularly copper, printed circuitry by an oxidative process so as to improve adhesion of the metal circuitry to the dielectric layers of multi-layer circuit boards. Because the major portion of printed circuitry is copper circuitry, the invention will be discussed herein in primarily in relationship to copper printed circuitry. However, the invention is generally applicable to metal surfaces which can be oxidatively micro-etched to provide increased surface area; which correlates to increased surface roughness thus, discussions with respect to copper surfaces are to be understood to pertain to other metal surfaces which may be oxidatively micro-etched for surface area enhancement.

BACKGROUND OF THE INVENTION

Successful fabrication of multi-layer printed circuit boards requires bonding together of copper and resin layers. However, direct bonding of copper and resin layers does not provide sufficient bonding strength. Therefore, it is common to improve copper-resin bonding strength by providing surface roughness to the copper surface, whereby mechanical bonding between the copper and resin is enhanced.

One common method of providing surface roughness is by depositing on the copper surface an oxide layer, such as cuprous oxide, cupric oxide, or the like. Formation of the oxide layer, which turns the pink copper surface a black-brown color, creates minute unevenness on the copper surface which provide an interlocking effect between the copper surface and resin, thus improving bonding strength.

However, copper oxides are readily degraded and dissolved upon contact with acid. Because various acid treatments are used in later stages of fabrication of multilayer circuit boards, oxide layer deposition has been problematic at best. In particular, through-holes are drilled through multilayer circuit boards, and the through-holes plated with copper to interconnect the circuitry of the several layers. As part of the copper-plating process, the through-holes are exposed to acids, such as sulfuric acid. Acid attack on the oxide layer in the region surrounding the through-holes is commonly referred to in the industry as "pink ring", because as acid strips the black-brown oxide layer from the surface, a ring of bare pink copper becomes evident. The problem of copper oxide vulnerability to acid has been approached in a number of patents, e.g. U.S. Pat. Nos. 4,642,161 and 4,717,439.

An alternative to building up a copper oxide coating on the copper surface is to micro-etch the copper surface to roughen the same; and it is to this method of surface roughening that the present invention is directed. Most commonly, this etching solution is an aqueous solution of a mineral acid, such as sulfuric acid, and an oxidizer agent, such as hydrogen peroxide. Such a solution is described in U.S. Pat. No. 4,751,106, the teachings of which are incorporated herein by reference. The micro-etching process roughens the copper, probably by oxidation of the metallic copper; the resulting topography on the metal surface provides better adhesion to resin. The micro-etched surface appears pink/tan to dark brown, probably the result of the topography of the surface and some residual copper oxide that is formed in the etching process. Micro-etched copper circuitry, when exposed to acid-based copper plating of through holes, is likewise subject to formation of "pink ring" through acid attack of the copper circuitry traces around the through-holes. The formation of "pink ring" is detrimental at least to appearance and is a potential indication of a failure in multi-layer printed circuit boards.

It is a primary object of the present invention to provide enhanced surface topography of micro-etched metal surfaces, particularly deeper surface etching, so as to increase bond strength between the metal surfaces and polymeric materials used in processes of producing multi-layer printed circuit boards. It is further an optional object of the present invention to provide acid-resistance to micro-etched copper circuitry so as to prevent or minimize acid attack problems such as "pink ring". In this regard, it is to be understood that there are a wide variety of possible processing steps in forming printed circuitry, and the invention, though described relative to a few common processing procedures, is generally applicable to providing increased surface topography roughness and optionally acid-resistance.

SUMMARY OF THE INVENTION

In accordance with one aspect of the invention there is provided an oxidative aqueous etching solution for micro-etching metal surfaces so as to increase the surface area of the metal surface and optionally providing acid resistance to the micro-etched metal surface. The solution contains a proton source; an oxidizer agent; an azole compound; and a source of molybdenum ions. This solution is used to micro-etch a metal, e.g., copper surface. Very substantial improvements in surface topography, i.e., differential surface etching (peak to valley height difference), is achieved through inclusion of the molybdenum ion source in conjunction with the azole compound than with a standard peroxide sulfuric acid micro-etch technology. Additionally, optional inclusion of a thiazole and/or thiocarbamide compounds provides unusually high resistance to acid attack as evidenced by significantly longer times that it takes for an HCl solution to change the color of a micro-etched board from brown to pink. This improved acid resistance translates to elimination or minimization of "pink ring" in the formation of multi-layer printed circuit boards and elimination or minimization of other acid attack related problems in printed circuit board formation.

As an alternative to providing a thiazole and/or thiaocarbamide in the micro-etch solution, the micro-etched metal surface may be post-treated with an aqueous solution of a thiazole compound, a thiocarbamide compound or a mixture thereof.

BRIEF DESCRIPTION OF THE DRAWINGS

FIG. 1 is a 5000X photo of a copper surface micro-etched with a comparative example solution containing no molybdenum ion.

FIG. 2 is a 5000X photo of a copper surface micro-etched with a solution in accordance with the present invention containing molybdenum ion.

DETAILED DESCRIPTION OF CERTAIN PREFERRED EMBODIMENTS

As stated above, although the discussion of this invention is primarily in respect to copper and copper alloys, the invention applies to any metal surface which may be oxidatively micro-etched, including, but not limited to, copper, nickel, cadmium, zinc, iron, aluminum, and alloys thereof For purposes of this invention, an "alloy" of a metal is a mixture of metals containing at least 50 wt % of the designated metal. Herein, when the singular is used for a component, the plural is meant in the alternative;.thus molybdenum compound is intended to encompass either a single molybdenum ion or a mixture of molybdenum salts or other sources of molybdenum. Herein, the term "aqueous solution" is intended to mean a solution in which the primary solvent is water; however, the term is intended to encompass solutions containing up to about 10 wt % water-miscible co-solvents.

The micro-etching process in accordance with the present invention is to be distinguished from processes in which portions of a copper layer are etched completely through such as to form circuitry traces of a printed circuit board. In micro-etching, no portion of copper, e.g., copper circuitry traces, are etched completely away; rather, the surface is etched or oxidized only to a limited extent so as to leave intact the original pattern of the copper being etched. Typically, the surface of the copper is etched by an oxidative process only to a depth of between about 20 and about 500 micro-inches as measured from the original surface to the depths of the micro-etching. This is accomplished by limiting the extent of etching according to the parameters, e.g., concentrations, temperature, etc. of the etching solution.

Most commonly the proton source is a mineral acid, typically sulfuric acid, although other mineral acids such as nitric acid, phosphoric acid, etc. may be used as well. Also, strong organic acids, such as methanoic may be used as the proton source. Acids are typically used at between about 0.5 and about 7.5 moles per liter. Preferably, the sufficient acid is used such that the pH of the solution is about 4 or below.

Oxidizer agents include, but are not limited to peroxides, particularly hydrogen peroxide, persulfate compounds, ferric compounds, cupric compounds and nitric acid. The oxidizer agent is typically used at between about 0.2 wt % and about 5 wt % of the solution. Hydrogen peroxide, if used as the oxidizer agent is typically used at about 0.1 and about 3.5 moles per liter. The oxidizer agent in conjunction with the proton donor are the primary agents for providing the micro-etching. Depending upon the degree of micro-etching required, etching times may vary from about 0.1 to about 10.0 minutes at temperatures between about 15 and about 70° C.

Enhanced differential etching, and thereby better copper to adhesion is achieved by the inclusion of the azole compound at levels of between about 0.2 wt % and about 2 wt %. Suitable classes of azole compounds include triazoles (including benzotriazoles), imidazole, and tetrazoles. Particularly suitable azole compounds include tolyltriazole, carboxytriazole, and imidazole. The preferred azole compound is benzotriazole. Additional suitable azole compounds are described, for example, in U.S. Pat. No. 3,770,530, the teachings of which are incorporated herein by reference.

The micro-etching solution includes a molybdenum source which provides molybdenum ions at a level of between about 2 and about 20,000 parts per million by weight (ppm) based on the weight of the molybdenum ion. Preferably the molybdenum ion is present at 20 to 1000 ppm, most preferably 60–200 ppm. By "molybdenum ion" is meant herein any molybdenum-containing ion soluble in the aqueous solution. Though applicants are not bound by theory, it is believed that any soluble molybdenum-containing ion in the presence of the oxidizer solution will be converted from whatever valence state it might be originally added to the solution to the +6 valence state. Preferred molybdenum sources are molybdate ($MoO_4^{-2}$) salts, e.g., sodium molybdate, and phosphomolybdic acid ($MoO_3H_3PO_4$). Other suitable molybdenum ion sources include, but are not limited to molybdic acid, molybdic anhydride and salts of phosphomolybdic acid. Molybdenum might be added to the solution as zero valence metal, provided the proton source and oxidizer are sufficiently strong to dissolve and ionize the metallic molybdenum.

Addition of the thiazole compound and/or thiocarbamide to the solution provides the micro-etched surface resistance to subsequent acid exposure. From the standpoint of minimizing processing steps, the thiazole and/or thiocarbamide compound is included in the micro-etching solution. If used, the total level of the thiazole compound and/or the thiocarbamide compound in the micro-etching is at least about 0.05 wt %, preferably at least about 0.3 wt %, up to saturation levels. While applicants are not bound by theory, it is believed that the thiazole and/or thiocarbamide compound bonds to the copper surface, e.g., by chelation, and thereby renders the copper (and any copper oxide) inaccessible to subsequent acid attack.

Thiocarbamide (thiourea) is the preferred thiocarbamide compound, although substituted thiocarbamide compounds, such as described in U.S. Pat. No. 4,715,894, the teachings of which are incorporated by reference, may also be utilized in accordance with the invention.

Along with thiazole, substituted thiazoles may also be used in accordance with the present invention. Suitable substituted thiazoles include, but are not limited to 2-amino thiazole and 2-mercaptobenzothiazole. Of these, 2-aminothiazole has given the best acid-resistance to date.

The aqueous solution may optionally contain between about 0.2 and about 10 wt % of a metal-chelating agent, such as ethylenediaminetetraacetate.

The aqueous solution may optionally contain a surfactant at a level of between about 0.05 and about 1.0% by weight. Suitable surfactants include, but are not limited to polyalkoxylated amines, sulfated and sulfonated amides, sulfated and sulfonated amines, glycerides and polyalkoxylated esters, betaines, and alcohols.

The aqueous solution may optionally contain between about 0.1 and about 10 wt % of a water-miscible organic solvent.

The aqueous solution may optionally include a source of halide ion, the source of halide ion providing the halide ion at between about 2 and about 50 ppm based on the weight of the halide ion. The preferred halide ion, if used, is chloride. The halide ion source may be a salt, such as sodium chloride, an acid, such as hydrogen chloride, or any other compatible chemical which provides such halide source. Other components may also provide the halide ion. For example, ionic surfactants, may provide chlorine ions.

The aqueous solution may also contain between about 250 ppm and about 50,000 ppm of an organic polymer. Suitable organic polymers include ethylene oxide, ethylene oxide-propylene oxide copolymers, polyethylene glycols, polyproplylene oxide copolymers, polyethylene glycols, polyproplyene glycols, polyvinyl alcohols, and mixtures thereof.

The aqueous solutions in accordance with the invention contain at least 40 wt % water.

As an alternative to including the thiazole compound and/or thiocarbamide compound in the micro-etching solution, an oxidatively micro-etched surface may be post-treated with an aqueous solution of a thiazole compound and/or thiocarbamide compound. Again, the total level of the thiazole compound and/or thiazole carbamide compound is at least about 0.2 wt %, preferably at least about 1 wt %, up to saturation levels.

The micro-etch solutions of the present invention are suitable for both immersion processes in which the circuit board is immersed in the solution and the conveyorized spray systems which afford substantial processing efficiencies.

The invention will now be described in greater detail by way of specific examples.

Comparative Example 1; and Example 2 in accordance with the invention

Comparative Example 1 was formulated as follows:
5% v/v sulfuric acid, 98% w/w
3% v/v hydrogen peroxide, 50% w/w
2.5 g/L benzotriazole Example 2, in accordance with the invention was formulated as follows:
5% v/v sulfuric acid, 98% w/w
3% v/v hydrogen peroxide, 50% w/w
5 g/L benzotriazole
200 ppm $Na_2MoO_4 2H_2O$ (79 ppm Mo ion)

Copper foil samples were chemically pre-cleaned. Then the samples were micro-etched in each of the Comparative Example 1 solution and the Example 2 solution for 2 min. at ambient temperature. Photomicrographs were taken and are provided herewith as FIG. 1 (Comparative Example 1) and FIG. 2 (Example 2). As can be seen, the mico-etching of FIG. 2. is substantially deeper than that of FIG. 1.

Each of the boards of FIG. 1 and FIG. 2 were laminated to pre-preg epoxy material. The peel strength of the material laminated to the FIG. 2 micro-etched board was several times that of the peel strength of material laminated to the FIG. 1 micro-etched board.

What is claimed is:

1. An aqueous micro-etching solution comprising molybdenum ions in conjunction with an azole compound in a sufficient amount to increase surface area on a metal surface; a proton source; and an oxidizing agent.

2. The aqueous micro-etching solution of claim 1, wherein the molybdenum ion concentration is between about 2 and 20,000 ppm.

3. The aqueous micro-etching solution of claim 1, wherein the molybdenum ion concentration is between about 20 and about 1000 ppm.

4. The aqueous micro-etching solution of claim 1, wherein the molybdenum ion concentration is between about 60 and about 200 ppm.

5. The aqueous micro-etching solution of claim 1, further comprising a metal-chelating agent.

6. The aqueous micro-etching solution of claim 5, wherein the metal chelating agent comprises between about 0.2% and about 10.0% by weight of the aqueous solution.

7. The aqueous micro-etching solution of claim 1, wherein the solution has a pH of about 4 or below.

8. The aqueous micro-etching solution of claim 1, wherein the oxidizing agent comprises between about 0.2 to about 5.0% by weight of the solution.

9. The aqueous micro-etching solution of claim 1, where the oxidizing agent is selected from the group consisting of a peroxide compound, a persulfate compound, a ferric compound, a cupric compound, nitric acid and mixtures thereof.

10. The aqueous micro-etching solution of claim 9, wherein the peroxide compound is hydrogen peroxide.

11. The aqueous micro-etching solution of claim 1, wherein the proton source is an organic or inorganic acid.

12. The aqueous micro-etching solution of claim 11, wherein the proton source is selected from the group consisting of sulfuric acid, nitric acid, phosphoric acid, hydrofluoric acid, methanoic acid, phenylsulfonic acid and mixtures thereof.

13. The aqueous micro-etching solution of claim 1, further comprising a compound selected from the group consisting of a thiazole, thiocarbamide and mixtures thereof in an amount to provide acid-resistance to micro-etched circuitry.

14. The aqueous micro-etching solution of claim 13, wherein the thiazole compound comprises 2-aminothiazole, 2-mercaptobenzothiazole or mixtures thereof.

15. The aqueous micro-etching solution of claim 13, wherein the thiocarbamide is thiocarbamide (thiourea).

16. The aqueous micro-etching solution of claim 13, wherein the thiazole compound or the thiocarbamide compound is present in an amount of at least about 0.05% by weight of the solution up to saturation level.

17. The aqueous micro-etching solution of claim 1, wherein a source of molybdenum ions is selected from the group consisting of molybdic acid, salts of molybdic acid, anhydrides of molybdic acid, phosphomolybdic acid, salts of phosphomolybdic acid, and mixtures thereof.

18. The aqueous micro-etching solution of claim 1, wherein the azole compound is present in an amount of between about 0.2 and about 2.0% by weight of the aqueous solution.

19. The aqueous micro-etching solution of claim 1, wherein the azole compound is selected from the group consisting of triazoles, tetrazoles, imidazoles, and mixtures thereof.

20. The aqueous micro-etching solution of claim 1, wherein the azole is benztriazole.

21. The aqueous micro-etching solution of claim 1, further comprising a surfactant.

22. The aqueous micro-etching solution of claim 21, wherein the surfactant comprises from about 0.05% to about 1.0% by weight of the solution.

23. The aqueous micro-etching solution of claim 1, further comprising between about 0.1 and about 10% by weight of a water-miscible organic solvent.

24. The aqueous micro-etching solution of claim 1, further comprising between about 2 and about 50 ppm of a halogen ion.

25. The aqueous micro-etching solution of claim 24, wherein the halogen ion is chlorine.

26. A method of micro-etching a metal surface comprising contacting the metal surface with an aqueous molybdenum micro-etching solution for a sufficient amount of time to increase surface area on the metal surface by micro-roughening the metal surface, the aqueous molybdenum micro-etching solution comprises molybdenum ions in conjunction with an azole compound in an amount sufficient to micro-roughen the metal surface; a proton source; and an oxidizing agent.

27. The method of claim 26, wherein the molybdenum ions in an amount between 2 and about 20,000 ppm.

28. The method of claim 26, wherein the aqueous molybdenum micro-etching solution comprises molybdenum ions in an amount between 20 and 1,000 ppm.

29. The method of claim 26, wherein the aqueous molybdenum micro-etching solution comprises molybdenum ions in an amount of between 60 and about 200 ppm.

30. The method of claim 26, wherein the oxidizing agent comprises between about 0.2% to about 10.0% by weight of the micro-etching solution.

31. The method of claim 26, wherein the oxidizing agent comprises a peroxide, a persulfate compound, a ferric compound, a cupric compound, nitric acid or mixtures thereof.

32. The method of claim 31, wherein the peroxide compound comprises hydrogen peroxide.

33. The method of claim 26, wherein the micro-etching solution has a pH of about 4 or below.

34. The method of claim 26, wherein the micro-etching solution further comprises a metal-chelating age.

35. The method of claim 26, wherein the proton source is an organic or an inorganic acid.

36. The method of claim 35, wherein the proton source comprises sulfuric acid, nitric acid, phosphoric acid, hydrofluoric acid, methanoic acid, phenylsulfonic acid or mixtures thereof.

37. The method of claim 26, wherein the micro-etch solution further comprises a thiazole, thiocarbamide or mixtures thereof.

38. The method of claim 37, where the thiazole compound comprises 2-aminothiazole, 2-mercaptobenzothiazole, or mixtures thereof.

39. The method of claim 37, wherein the thiocarbamide comprises thiocarbamide (thiourea).

40. The method of claim 37, wherein the thiazole or thiocarbamide comprises at least about 0.05% by weight up to saturation of the micro-etch solution.

41. The method of claim 37, wherein the azole compound comprises between about 0.2% to about 2.0% by weight of the micro-etch solution.

42. The method of claim 26, wherein the azole compound comprises triazoles, tetrazoles, imidazoles, or mixtures thereof.

43. The method of claim 26, wherein the azole compound comprises benztriazole.

44. The method of claim 26, wherein the micro-etch solution further comprises a surfactant.

45. The method of claim 26, wherein the micro-etch solution further comprises a water-miscible organic solvent in an amount between about 0.1% to about 10% by weight of the micro-etch solution.

46. The method of claim 26, wherein the micro-etch solution further comprises between about 2 and about 50 ppm of a halogen ion.

47. The method of claim 46, wherein the halogen ion chlorine.

48. The method of claim 26, wherein the metal comprises copper, nickel, cadmium, zinc, iron, aluminum, or alloys thereof.

49. The method of claim 26, where micro-etching is performed from about 0.1 to about 10 minutes.

50. The method of claim 26, wherein micro-etching is performed at a temperature of from about 15° C. to about 70° C.

* * * * *